United States Patent [19]

Carpentier et al.

[11] Patent Number: 4,733,094

[45] Date of Patent: Mar. 22, 1988

[54] BIDIRECTIONAL OPTOELECTRONIC COMPONENT OPERATING AS AN OPTICAL COUPLING DEVICE

[75] Inventors: Jean F. Carpentier, Meudon la Foret; Philippe Morel, Paris; Jacques Simon, Ris Orangis, all of France

[73] Assignee: Thomson-CSF, Paris, France

[21] Appl. No.: 861,567

[22] Filed: May 9, 1986

[30] Foreign Application Priority Data

May 10, 1985 [FR] France ................... 85 07147

[51] Int. Cl.$^4$ .................. G02B 27/00; H01L 31/12
[52] U.S. Cl. ........................... 250/551; 357/19
[58] Field of Search .................. 250/227, 551; 350/96.15; 357/19; 455/606, 618, 619

[56] References Cited

U.S. PATENT DOCUMENTS

| | | | |
|---|---|---|---|
| 3,617,932 | 11/1971 | Paoli et al. | 357/19 |
| 4,351,585 | 9/1982 | Winzer et al. | 250/227 |
| 4,457,582 | 7/1984 | Lewis et al. | 455/606 |
| 4,549,782 | 10/1985 | Miller | 357/19 |
| 4,611,886 | 9/1986 | Cline et al. | 357/19 |

Primary Examiner—David C. Nelms
Assistant Examiner—Stephone B. Allen
Attorney, Agent, or Firm—Oblon, Fisher, Spivak, McClelland & Maier

[57] ABSTRACT

The invention concerns bidirectional optical fiber connections, and more particularly an optical coupling device between an emitting electroluminescent diode and a detecting photodiode, the optoelectronic component according to the invention comprising an electroluminescent diode called DEL sealed in a box of the transistor box type the cover of which carries a microlens centered on the optical axis of the box, while inside the box are integrated: a photodiode mounted at the side of the DEL and outside the optical axis, a semitransparent mirror and a mirror support, this support being machined so as to form a second mirror that reflects light to be detected towards the detecting diode; the novel component can be used in bidirectional optical connections, in computers and telephone exchange centers.

9 Claims, 12 Drawing Figures

BIDIRECTIONAL OPTOELECTRONIC COMPONENT OPERATING AS AN OPTICAL COUPLING DEVICE

BACKGROUND OF THE INVENTION

1. Field of the Invention

The present invention concerns an optoelectronic component, utilized in optical fibers data transmission systems. This optoelectronic component is a coupling device that comprises at least one electroluminescent diode and a photodiode: the assembly constituted by these two diodes is integrated in a standard sealing box for transistors. The invention applies more particularly to bidirectional connections through a single optical fiber called monofiber.

2. Background of the Prior Art

In a monofiber bidirectional optical connection, the single optical fiber transmits, in a direction called forward direction, the light which is emitted by an electroluminescent diode, commonly called a LED, placed at a first end of the fiber, and which is received by a photodiode placed at a second end of the fiber. In the other direction, that will be called the backward direction, the light emitted by a second LED, placed at the second end of the fiber, is received by a second photodiode, placed at the first end of the fiber. Thus at each end of the optical fiber, a LED and a photodiode are provided that must both be optically connected with to the adjacent end of the optical fiber. Known solutions for establishing this optical connection are generally rather bulky; the coupling devices are constituted by a housing or box the faces of which support the optical connecting devices. At least one connecting device is provided for the optical fiber, another connecting device for the LED in its microbox and yet another connecting device for the photodiode in its microbox. Inside the box enclosing the coupling device, simple means couple or connect the LED to the optical fiber and the photodiode to the optical fiber. The main drawback of these coupling devices, although they are simple, is their bulk; furthermore, due to the very small dimensions of the optical fibers used in bidirectional systems (50–100 μm) these coupling devices require high machining accuracy at each connection made by means of connectors.

The optoelectronic component according to the invention has a far smaller volume than known coupling devices, and it can easily be aligned with the optical axis of the optical fiber. It comprises at least one LED and a photodiode, and at least one semitransparent mirror, but it is characterized in that the assembly is integrated in a standard transistor sealing, box or housing provided with a microlens on the planar surface of its cover. The LED and the photodiode are mounted side by side, on an insulating base plate, the DEL being located on the optical axis of the microlens and provided with an optical microbead, in order to concentrate its luminous radiation on the microlens. The photodiode receives the luminous radiation entering the box, or a part of the luminous radiation emitted by the DEL, by means of a set of mirrors positioned inside the cover or lid of the box; at least one semitransparent mirror is maintained in position by a piece machined face of which is opposed to the photodiode and assumes the function of a mirror.

SUMMARY OF THE INVENTION

More precisely, the present invention concerns a bidirectional optoelectronic component, for the emission and detection of a luminous radiation, operating as an optical coupling device between an emitting electroluminescent diode and at least one detecting photodiode, the electroluminescent diode, called DEL, being mounted in a metallic box of the transistor box type the base plate of which supports an insulating block onto which is fixed the DEL and the cover of which supports a microlens centered on the planar face of the cover, the microlens and the DEL defining an optical axis for this optoelectronic component, wherein are integrated within the box of the DEL:

at least one detecting photodiode, mounted on the insulating block on the side of the DEL and outside the optical axis of the component;

first means for reflecting the detected luminous radiation, constituted by a semitransparent mirror placed between the DEL and the microlens, on the optical axis of the component and inclined with respect to said axis;

second means for reflecting the luminous radiation in the direction of the detecting diode, constituted by a reflecting surface, the plane of which is parallel to the plane of the semitransparent mirror, the piece on which is produced the reflecting surface comprising a planar support surface for a semitransparent mirror.

BRIEF DESCRIPTION OF THE DRAWINGS

The invention will become more clearly apparent and its advantages and features better understood from the following description of embodiments of the invention, given with reference to the appended drawings wherein.

DETAILED DESCRIPTION OF THE DRAWINGS

Figure 1:
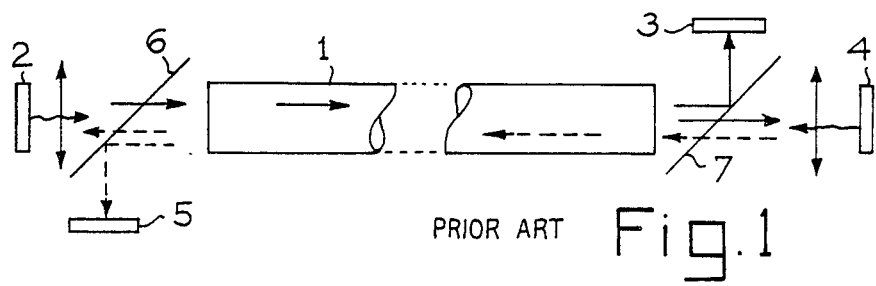
FIG. 1 is a schematic diagram of a bidirectional connection by optical fiber, according to the prior art.

FIG. 1 schematically represents a bidirectional optical fiber connection, according to the known art and its description will render more apparent the interest of the optoelectronic component according to the present invention.

A bidirectional optical fiber connection comprises an optical fiber 1, at a first end of which is located an electroluminescent diode LED, schematized at 2 by the representation of its semiconducting inset or pellet. This LED emits a luminous radiation concentrated by a microlens and propagated along the optical fiber according to the arrows represented in full lines. At the other end of the optical fiber 1 is located a detecting photodiode 3 which picks up the light emitted by the LED. The fact that this connection is bidirectional implies that at the second end of the optical fiber 1 is also located a second DEL 4 the luminous radiation of which, concentrated by a microlens, travels through the same optical fiber 1, according to a path schematized by the arrows shown in broken lines: the luminous radiation of the LED 4 is picked up at the first end of the optical fiber by a photodiode 5. Since both an emitting LED 2 or 4 and a detecting photodiode 3 or 5 are located at each end of the optical fiber 1, it is necessary partially to deflect the luminous rays in such a way that these two LED 2 and 4 and the two photodiodes 3 and 5 are respectively coupled to the optical fiber. The means for deflecting the luminous rays are schematically shown in the form of mirrors 6 and 7 each one of which is placed at a respective end of the optical fiber; these mirrors are semitransparent which implies that part of the radiation emitted by the LED 2 crosses through mirror 7 and strikes the LED 4, and that similarly part of the radiation emitted by the LED 4 crosses through mirror 6 and strikes the LED 3, whereas the corresponding radiations are reflected by the surfaces of the semitransparent mirrors 6 and 7 and strike the photodiodes 3 and 5. The diagram represented in FIG. 1 is, as explained herein-above, a schematic diagram; in actual practice the connections between the LED and the photodiode are constructed in a different manner.

Figure 2:
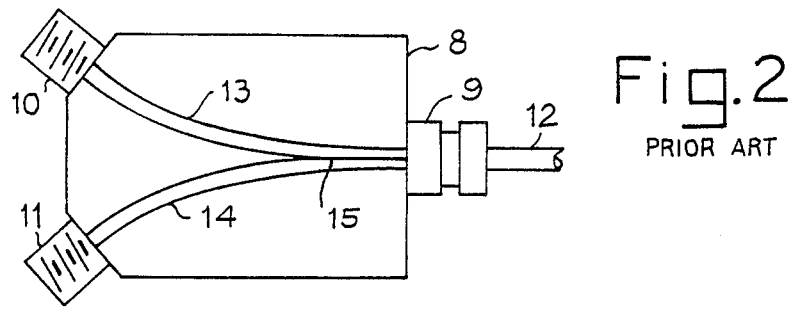
FIG. 2 is a diagram of an optical coupling device according to the prior art.

FIG. 2 represents a highly simplified diagram of an optical coupling device according to the prior art. This first type of coupling device comprises a box 8 which has any convenient form, provided that to it can receive three connectors 9, 10 and 11 affixed thereto at the apex of a triangle. An optical fiber 12 that corresponds to fiber 1 of FIG. 1 is connected to this coupling device by means of a connector 9 of which only the base plate has been represented, the LED itself being mounted inside a microbox. A photodiode is connected to the coupling device by means of a second connector 11, which for the same reasons is represented simply by its threaded base plate. The coupling of the luminous radiation between the optical fiber 12 on the one hand, and the LED and the photodiode on the other hand is performed by means of two optical fibers 13 and 14, located inside the box 8 of the coupling device that protects them.

These two optical fibers 13 and 14 are machined at 15, so as to produce on each of them a flattened portion, and the two fibers are positioned flattened portion against flattened portion in the connector 9 of the optical fiber 12. The two fibers 13 and 14 are furthermore connected in the base plates of connectors 10 and 11. It is obvious that this type of coupling device that utilizes at least three connectors and a box with two optical fiber pieces occupies a certain volume, which is not same order as the volume occupied by a LED, or by a photodiode, or which corresponds to the scale of the diameter of the optical fiber which is from 50 to 100 microns.

Figure 3:
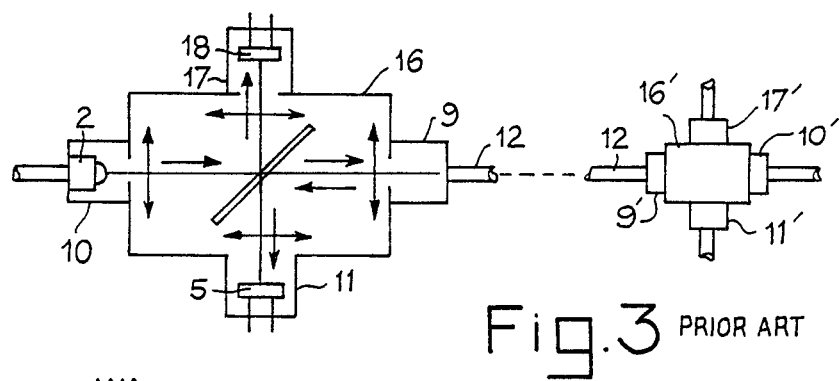
FIG. 3 is a diagram of a different optical coupling device according to the prior art.

FIG. 3 represents another type of coupling device according to the prior art. This device has the form of a box 16 that comprises on four faces, preferably disposed according to a square or a rectangle, four connectors 9, 10, 11 and 17. The first connector 9 is attached, as in the device of FIG. 2, to one end of an optical fiber 12. The second connector 10 supports an electroluminescent diode 2 which emits a luminous radiation in the direction of fiber 12. Consequently, connector 10 is located on the optical axis of fiber 12, and on a wall of box 16 parallel to the wall that supports connector 9. Connector 11 supports a photodiode 5 and is located on a wall parallel to the optical axis of fiber 12; the luminous radiation is reflected towards photodiode 5 by a semitransparent mirror 6, positioned at 45° with respect to the path of the luminous radiation between photodiode 2 and optical fiber 12. Furthermore, a second photodiode 18, supported by a connector 17 can be mounted facing the first photodiode 5. This second photodiode 18 receives, by means of the same semitransparent mirror 6, part of the light emitted by the LED 2 and thus acts to control the emitting power of the LED. Lenses are generally provided in order to ensure improved coupling and obtain beams parallel to the mirror.

A box 16' is located at the other end of the optical fiber 12 and is strictly similar to box 16; it also comprises connectors in order to interconnect optical fiber 12, a second LED and one or two photodiodes.

In both cases the connecting devices according to the prior art that have been described herein-above, the volume or space required is an important factor. In fact, the bidirectional optical connections are utilized if the loss of optical power in the coupling devices can be compensated by a greater emitting power of the electroluminescent diodes. This disadvantage is compensated by the fact that in extremely complicated systems, such as telephone control centers, for example, a single optical fiber allows data to be transmitted in both directions, which results in considerable decrease in space requirement in the case of high-density multifiber cables. This space saving in the field of multifiber cables would be lost if at the end of each optical fiber the coupling device were itself a bulky object.

Furthermore, the machining of optical fiber of a diameter even of 100 microns is a delicate operation, and the adjustment and alignment of an optical fiber in its connector with respect to two or three diodes mounted on their connectors 10 or 11 or 17 requires extreme care; consequently, these coupling devices thus present drawbacks that render them unsuitable for utilization in industry.

It is thus an object of the invention to provide a coupling system that is pre-adjusted during manufacturing, and which only occupies a small volume, compatible with the range of diameter values of optical fibers. The space required by the optoelectronic component according to the invention is that of a metallic standard transistor box of the type T018 or T046, i.e. having an outer diameter of 5.4 mm.

Figure 4:
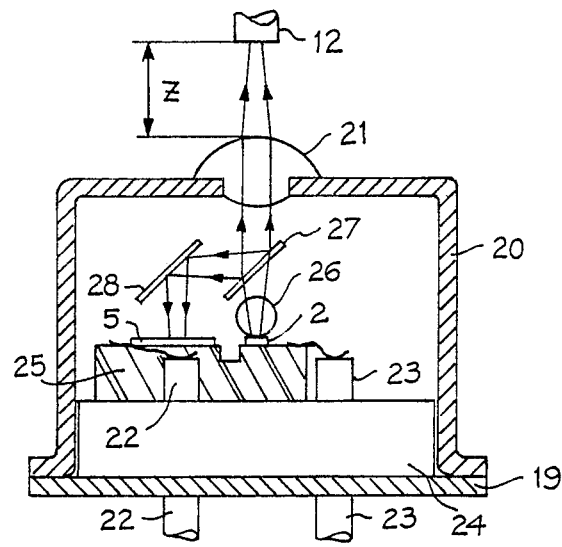
FIG. 4 is a simplified cross-sectional view of an optoelectronic component according to the invention, comprising an emitting LED and a receiving photodiode.

FIG. 4 represents a cross-sectional view of an optoelectronic component according to the invention, this view being simplified so as to facilitate reading of said drawing. This optoelectronic component comprises an emitting electroluminescent diode and a receiving photodiode.

The optoelectronic component shown in FIG. 4 is mounted in a standard transistor box, of the TO18 type. This box comprises a base plate 19 and a cover 20, the base plate 9 comprising itself at least one metallic crown so as to be able to be soldered to the cover 20.

Cover 20 comprises, on its planar portion and located on the axis of symmetry of the box, a microlens 21, generally made of glass, that defines an optical axis for the box.

Base plate 19 supports a plurality of external access connections 22 and 23, at least two of them being provided, i.e. one for each diode. These external access connections 22 and 23 that are present in the form of metal wires, are maintained in place by a part 24 that is made either of glass, or of metal, integral with the base plate 19. In this case, the external connection passages 22 and 23 are insulated by glass beads.

If the box only comprises two external connections 22 and 23 for the two diode pellets or insets, the earth connection can be taken directly upon the box.

The electroluminescent diode inset or pellet 2 and the inset or pellet 5 of the photodiode are mounted, by appropriate soldering or glueing means, side by side on an insulating base plate 25, which is for example made of beryllium oxide. These two insets are mounted so that the electroluminescent diode inset 2 is located on the optical axis of the microlens 21 carried by the box cover and are aligned with the optical fiber 12.

A microbead, which is made either of glass, or of corundon, plastic material or semiconductor material constituting the LED chip itself, is glued onto the emitting surface of the electroluminescent pellet 2: this microbead 26 acts as a microlens in order to concentrate the luminous radiation emitted by the electroluminescent diode -which emits according to a fairly wide angle- in the direction of microlens 21 so as to recover the maximum of luminous energy of the LED and to improve the efficiency.

Due to the fact that inset 2 of the LED is located on the optical axis of the system, inset 5 of the photodiode is thus located outside this axis. In order that the luminous radiation emitted by the other LED, located at the other end of the optical fiber 12 arrives at the photodiode 5, two mirrors 27 and 28 are disposed inside the box of this optoelectronic component. Mirror 27 is a semi-transparent mirror, constituted by a glass or fine quartz strip interposed between microbead 26 and microlens 21. According to well known optics laws this mirror is inclined at 45° with respect to the optical axis. A second mirror 28, also inclined at 45° with respect to the optical axis, is opposed to the first mirror 27 so that a luminous radiation issuing from the optical fiber 12 is reflected a first time by semitransparent mirror 27 then a second time by mirror 28 prior to reaching the inset of photodiode 5.

The manner in which mirrors 27 and 28 are positioned inside the box will be explained in detail herein-below. Of course, and although this has not been described, the insets are soldered onto the base plate 25 by known processes, and they are connected to the external connections 22 and 23 by any reliable means known to those skilled in the art, such as for example metal wires or metal bands.

For an optical fiber having a diameter of 50 or 100 microns, the diameter of the microbead 26 can be comprised between 200 and 700 microns. The distance between the microbead 26 and the microlens 21 is about 1.5 mm and it allows to use a mirror 27 having a thickness of about 0.1 mm. the focal length of microlens 21 is about one millimeter, and the frontal distance Z, which separates microlens 21 from the end of the optical fiber 12, is comprised between 0.5 and 1.5 mm.

The operating of this optoelectronic component is the same as that explained with reference to FIG. 1. The LED 2 emits a luminous radiation which is first recovered and concentrated by microbead 26, crosses -with a certain loss through reflection- through semitransparent mirror 27 prior to being focalized by microlens 21 on the core of fiber 12. The photodiode receives the optical signal issuing from the fiber through the intermediary of microlens 21, semitransparent mirror 27 and reflecting surface 28.

The originality of this optoelectronic component resides in the fact that only three elements need be added to a conventional emitting component in order to transform it into a component having an emitting function and a receiving function, i.e. into a coupling device. A LED 2, provided with its microbead 26, mounted in a metallic box 19+20 provided itself with a microlens 21 is a known component. It is sufficient to add a semi-transparent mirror 27, a mirror support which, as will be seen herein-below, constitutes itself a second reflecting surface 28 and a photodiode 5, so as to transform this known emitting component into a novel emitting-receiving component. It will be noted that lens 21 causes the luminous beam to converge towards the photodiode, and thus allows utilization of a photodiode having a small surface.

Figure 5:
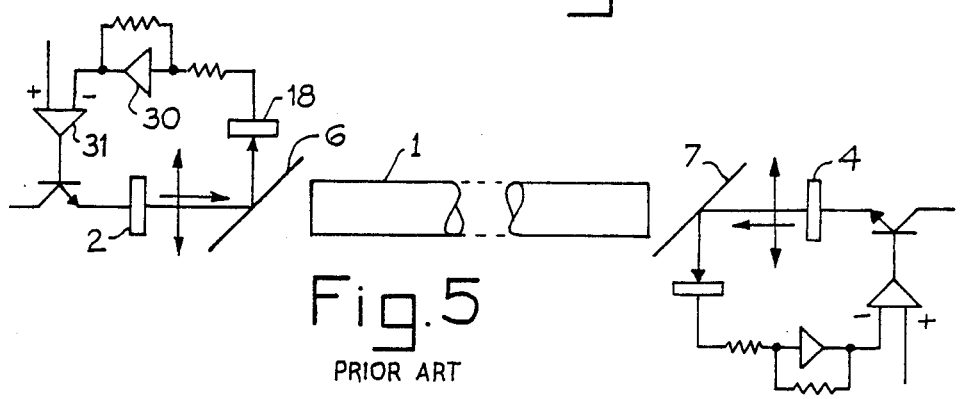
FIG. 5 is a schematic diagram of a simple connection through optical fiber according to the prior art, comprising an emitting control for each LED at the ends of the optical fiber.

FIG. 5 represents the schematic diagram of a bidirectional connection according to the prior art, comprising a control of the luminous power emitted by a LED. If the emitter assembly located at one end of an optical fiber is considered, it is possible to improve the efficiency of the bidirectional connection by servo-controlling the luminous radiation emitted by the LED 2 through a very simple an known control system. A semi-reflecting strip 6 is placed between the LED 2 and an optical fiber 1 and it reflects part of the light emitted by the LED in the direction of a photodiode 18. The signal of a photodiode 18 is integrated by an integrator 30 which is connected to one of the two input terminals of a differential amplifier 31. The output of this amplifier itself controls the base of a transistor which feeds current to the LED 2. If, for reasons any of variation in temperature or aging, for example, the LED 2 emits a luminous power that is not stable, the counter feedback loop allows to correct and obtain a stable luminous power.

Figure 6:
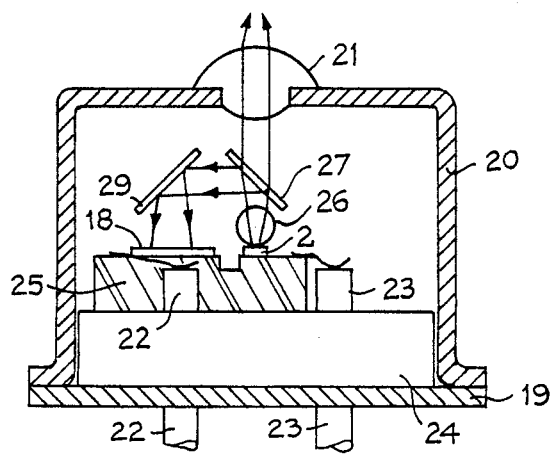
FIG. 6 is a cross-sectional view of a simplified optoelectronic component according to the invention, comprising an emitting LED and an adjusting photodiode for adjusting the luminous power emitted.

This type of optoelectronic component comprising an emitted power control can be obtained according to the invention, as shown in FIG. 6.

The optoelectronic component according to the invention as represented in FIG. 6 comprises exactly the same constituents as that represented in FIG. 4. But in FIG. 4 the luminous radiation received by the photo diode 18 issues from the optical fiber 12, and consequently the two reflecting surfaces 27 and 28 are parallel to each other, so that a luminous ray issuing from the optical fiber arrives at the photodiode 18. On the contrary, in FIG. 6 the two reflecting surfaces 27 and 29 are mounted orthogonally and part of the luminous radiation emitted by the pellet 2 of the LED is reflected onto the semitransparent mirror 27, then reflected by the reflecting surface 29 and thus received by the photodiode LED 2, so that the power emitted by the LED 2 can be controlled. As in the case of FIG. 4, the means for maintaining and positioning the two reflecting surfaces 27 and 29 will be described below.

Figure 7:
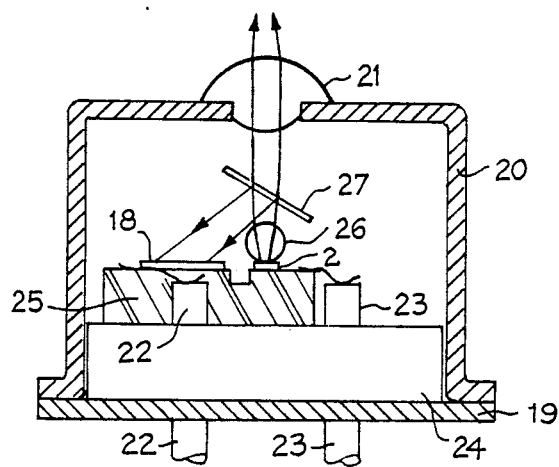
FIG. 7 is a simplified cross-sectional view of an optoelectronic component according to the invention, including a variant in the optical system, for controlling the emitted luminous power.

FIG. 7 represents a cross-sectional view of an optoelectronic component according to the invention, but with a variant of the optical system.

According to this variant, the photodiode 18 receives part of the luminous radiation emitted by the LED 2, through the intermediary of a single semireflecting surface 27, which is mounted on the optical axis of the system, at an angle of about 30°, this angle being adjusted in accordance with the position occupied by the photodiode and its distance from the inset 2 of the LED. This semitransparent mirror 27 is similar to that of the embodiments of FIGS. 4 and 6 in that it is maintained by a mirror support that will now be described in detail with reference to the following figures.

Figure 8:
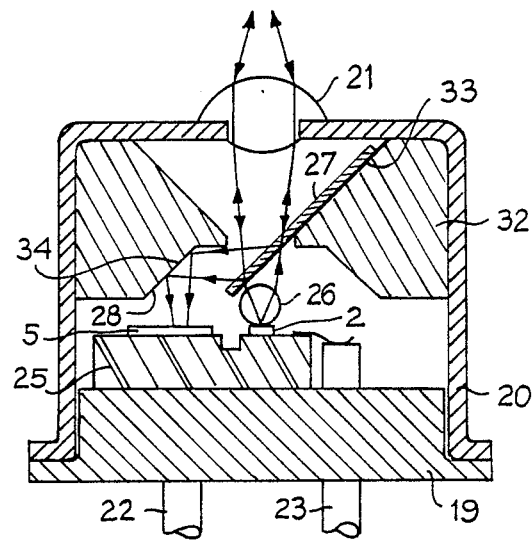
FIG. 8 is a cross-sectional view of an optoelectronic component according to the invention for emitting and receiving, showing the optical mirror support system.

FIG. 8 shows more details than FIG. 4; it represents the same optoelectronic component for emitting and receiving a luminous radiation. It shows more particularly the mirror support, according to the invention, that allows to transform in a simple manner an electroluminescent diode into an emitting receiving coupling device.

A mirror support 32 is mounted inside the cover 20 of a transistor box, provided with a microlens 21, and has a cylindrical form since the transistor boxes of type T018 or T046 are cylindrical. By way of comparison, the piece 32 enters the cover 20 in the same way that a piston penetrates a cylinder. More generally, the external outline of support 32 is adapted to the internal outline of cover 20 of the box. Piece 32, which was thus originally a cylinder, has undergone on each of its planar faces a milling operation. On one face, milling has allowed to produce a planar face 33 inclined at 45° with respect to the main optical axis of the system, i.e. also inclined at 45° with respect to the original planar face of piece 32. The semitransparent mirror 27 is glued or secured by any suitable means on this planar face 33.

The second planar face of the mirror support 32 has undergone a second milling operation which has produced at least one planar face 34 inclined at 45° with respect to the optical axis of the system, i.e. also inclined at 45° with respect to the second planar face of piece 32. The two machined faces are so arranged that they define in the middle of the support 32 a hole centered on the optical axis of the device and thus allowing the luminous rays to pass. Furthermore, this surface 34 inclined at 45° is treated and polished so as to constitute a reflecting surface having a good optical quality. Similarly, the first face 33 and the second face 34, both inclined at 45° with respect to the optical axis of the system, face each other so that a said luminous ray issuing from the optical fiber and crossing through the microlens 21 is reflected a first time by mirror 27 glued to the face 33, and then a second time by face 34, that constitutes thus the mirror 28, prior to striking photodiode 5.

Figure 9:
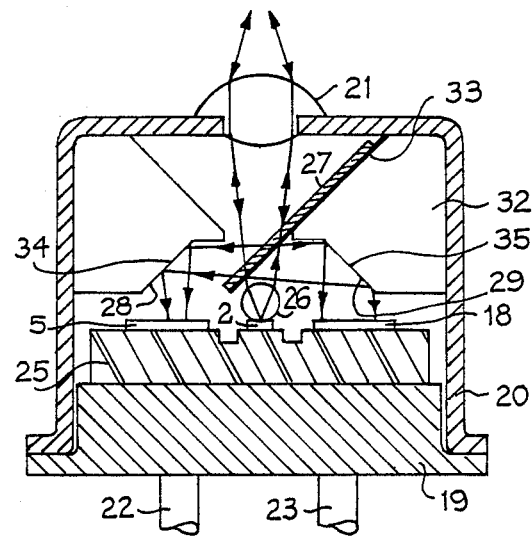
FIG. 9 is a cross-sectional view of the optoelectronic component according to the invention for emitting, power controlling and receiving, showing the optical mirror support system.

FIG. 9 constitutes a more complete example of the optoelectronic component according to the invention, since this component comprises an emitting DEL 2, a receiving diode 5 and a photodiode 18 for controlling the power emitted by the DEL 2.

In this case, the three pellets or insets of the diodes are mounted side by side on an insulating block 25, in the same way as two diode insets were previously mounted on this insulating block 25. It is well understood that the number of external connections such as 22 and 23 is adapted to the number of diode insets. The reflection of the light issuing from the optical fiber towards the photodiode 5 occurs as described hereinabove by means of a semitransparent mirror 27 and a reflecting surface 28. But the control and the adjustment of the power emitted by the DEL 2 by means of a photodiode 18 is performed as mentioned previously with reference to FIG. 6 by means of a first reflection on the semitransparent mirror 27 and of a second reflection on the mirror 29 constituted by a reflecting portion 35 of the mirror support piece 33. On account of the planar nature of the semitransparent mirror 27 the reflection of a ray issuing from the LED 2 in the direction of the photodiode 18 and the reflection of a luminous ray issuing from the optical fiber in the direction of the photodiode 5 occurs symmetrically; consequently, the reflecting surfaces 34 and 35 of the mirror support piece 33 face each other and their generatrices are parallel to each other.

Figure 10:
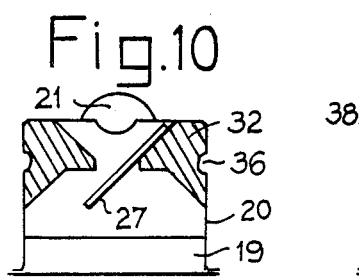
FIGS. 10, 11 and 12 show three systems for attaching the mirror support inside the cover of the box.
Figure 11:
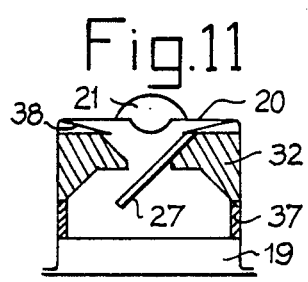
Figure 12:
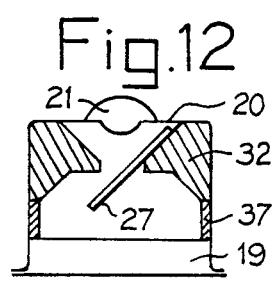

FIGS. 10, 11 and 12 represent in a very simplified manner the different means for maintaining in place the mirror support piece 33 inside the box cover 20.

For enhanced simplicity, on these figures only the base plate 19 and the hood 20, the optical system constituted by the microlens 21 and the mirror 27 as well as the mirror support 33 have been represented. A first manner to fix the optical mirror system inside a hood or cover 20 of a transistor box consists in crimping the support 33 by deformation of the hood 36; this crimping process is well known, the metal constituting a hood 20 as well as the metal constituting the mirror support 33 are sufficiently flexible for it to be possible to produce thereupon deformations such as 36 with a metallic point.

A second process for positioning the optical system inside the hood 20 of the transistor box consists in maintaining the mirror support 33 at a predetermined distance from the base plate 19 by means of a washer 37, and exerting a force, that pushes the support 33 in the direction of the base plate 19, by means of a non planar washer forming a spring which is placed in 38 between the planar surface of the cover 20 and the mirror support 33.

Furthermore, another possibility, represented in FIG. 12, consists in simply forcibly introducing the mirror support piece 33 into the hood or cover 20, or in fixing it by glueing in this hood while adjusting its distance from the base plate 19 by means of a washer 37. In the different cases shown in the figures, the mirror support 33 is made of metal, milled or crimped, or is injected in the form of a polymer the surfaces 34 and 35 of which are rendered reflecting by vacuum metallization.

The semitransparent mirror 27 is constituted by a fine glass or quartz strip, having a thickness of about 0.1 mm and accordance with the application envisaged for the optoelectronic component, i.e. depending on the wavelength of the luminous radiation, the mirror 27 has a transmission coefficient that is determined by an appropriate surface treatment.

The optoelectronic component according to the invention is essentially used in high-density connections by optical fiber, such as data exchange connections in data processing or in telephone systems.

We claim:

1. A bidirectional optoelectronic photocoupler comprising:
    a encapsulating box;
    a micro lens mounted through the top surfaces of said box;
    a light emitting diode mounted on a mounting surface on the bottom of said box in line with the optical axis of said microlens;
    at least one detecting photodiode mounted on the same mounting surface as said light emitting diode and outside the optical axis of said microlens;
    first planar reflecting means placed within said box along the optical axis of said microlens and inclined with respect to said axis made of a semitransparent mirror;
    second planar reflecting means placed within said box in a parallel plane to said first planar reflecting means; and
    support means for holding said first and second planar reflecting means in said box.

2. An optoelectronic photocoupler according to claim 1, wherein the luminous radiation emitted by said light emitting diode is essentially transmitted without deflection, along the optical axis of the microlens through the first plane reflecting means and is partially reflected by the face of the said, second planar reflecting means which is located opposite the light emitting diode 3. An optoelectronic photocoupler according to claim 1, further comprising;
    a adjusting photodiode, mounted on the mounting surface next to the light emitting diode for providing a feedback signal to control said light emitting diode;
    third reflecting means, for reflecting in the direction of the adjusting photodiode the luminous radiation emitted by the light emitting diode and partially reflected by the semitransparent mirror.

4. An optoelectronic photocoupler according to claim 1, 2 or 3, wherein semitransparent mirror is constituted by a strip of transparent material, such as glass or quartz, the faces of which are treated so as to confer thereupon a transmission coefficient suitable for the luminous radiation.

5. An optoelectronic photocouplet according to claim 1, wherein the support means comprises a piece, the external profile of which corresponds to the internal profile of the cover of the box, said support being provided at its center with a hole centered on the optical axis for the passage of the luminous radiation, and being provided on the side facing the microlens and with a plane inclined with respect to the optical axis and on which is fixed the semitransparent mirror, and further provided on the side of the light emitting diode with at least one plane the surface of which is polished, forming at least one reflecting surface.

6. An optoelectronic photocoupler according to claim 5, wherein the support means is fixed inside the cover of the box by force fitting and glueing.

7. An optoelectronic photocoupler according to claim 5, wherein the support means is fixed within the cover of the box by local deformation of the cover.

8. An optoelectronic photocoupler according to claim 5, wherein the support means is positioned inside the cover of the box by means of a sleeve that rests upon the base plate of the box, and is maintained in position by means of a resilient washer.

9. An optoelectronic photocoupler according to claim 1, which is associated to an optical fiber in a monofiber bidirectional connection.

* * * * *